(12) United States Patent
Zhang

(10) Patent No.: US 11,800,782 B2
(45) Date of Patent: Oct. 24, 2023

(54) DISPLAY PANEL, AND DISPLAY DEVICE INCLUDING LIGHT-TRANSMITTING PLANARIZATION LAYER IN BLIND HOLE

(71) Applicant: Wuhan China Star Optoelectronics Semiconductor Display Technology Co., Ltd., Hubei (CN)

(72) Inventor: Yunti Zhang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 299 days.

(21) Appl. No.: 17/283,567

(22) PCT Filed: Feb. 26, 2021

(86) PCT No.: PCT/CN2021/078015
§ 371 (c)(1),
(2) Date: Apr. 8, 2021

(87) PCT Pub. No.: WO2022/165883
PCT Pub. Date: Aug. 11, 2022

(65) Prior Publication Data
US 2023/0108673 A1   Apr. 6, 2023

(30) Foreign Application Priority Data

Feb. 3, 2021  (CN) .......................... 202110149011.6

(51) Int. Cl.
*H10K 50/84*    (2023.01)
*H10K 59/12*    (2023.01)
*H10K 50/86*    (2023.01)
*H10K 50/87*    (2023.01)
*H10K 59/65*    (2023.01)
*H10K 59/35*    (2023.01)
*H10K 59/60*    (2023.01)
*H10K 77/10*    (2023.01)
(Continued)

(52) U.S. Cl.
CPC ........... *H10K 77/10* (2023.02); *H10K 50/844* (2023.02); *H10K 50/86* (2023.02); *H10K 50/87* (2023.02);
(Continued)

(58) Field of Classification Search
CPC ...... H10K 50/844; H10K 50/86; H10K 50/87; H10K 50/8428; H10K 50/868;
(Continued)

(56) References Cited

U.S. PATENT DOCUMENTS

2010/0090297 A1* 4/2010 Nakatani ............... G01L 9/0016
257/415
2013/0277777 A1* 10/2013 Chang ................. B81C 1/00269
438/51
(Continued)

FOREIGN PATENT DOCUMENTS

CN       110544433         12/2019
CN       110556404 A    *  12/2019
(Continued)

OTHER PUBLICATIONS

International Search Report and the Written Opinion dated Nov. 9, 2021 From the International Searching Authority Re. Application No. PCT/CN2021/078015 and Its Translation Into English. (13 pages).

*Primary Examiner* — Ida M Soward

(57) ABSTRACT

The present application discloses a display panel, a method of manufacturing the same, and a display device, wherein the display panel includes a first substrate, a second substrate, and a light-transmitting planarization layer, a light transmittance of the first substrate is lower than that of the second substrate; at least one first through hole is provided on the substrate, at least one blind hole is provided on the second substrate, and the blind hole is provided corresponding to the first through hole; the light-transmitting planarization layer is provided in the blind hole to flatten the bottom of the blind hole, thus obtaining a relatively flat film surface.

12 Claims, 6 Drawing Sheets

(51) Int. Cl.
  *H10K 71/00* (2023.01)
  *H10K 50/844* (2023.01)
  *H10K 50/842* (2023.01)
  *H10K 59/127* (2023.01)
  *H10K 50/80* (2023.01)
  *H01L 27/146* (2006.01)

(52) U.S. Cl.
  CPC ............. *H10K 59/65* (2023.02); *H10K 71/00* (2023.02); *H01L 27/14678* (2013.01); *H10K 50/8428* (2023.02); *H10K 50/868* (2023.02); *H10K 59/127* (2023.02); *H10K 59/35* (2023.02)

(58) Field of Classification Search
  CPC ...... H10K 59/65; H10K 59/127; H10K 59/35; H10K 77/10; H10K 59/60; H10K 59/8794; H10K 59/12; H01L 27/14678; H01L 27/1218; H01L 27/1262
  See application file for complete search history.

(56) References Cited

U.S. PATENT DOCUMENTS

| | | | | |
|---|---|---|---|---|
| 2014/0003633 | A1* | 1/2014 | Liu | H04R 23/00 381/174 |
| 2014/0322100 | A1* | 10/2014 | Laermer | B65B 3/00 53/410 |
| 2016/0137487 | A1* | 5/2016 | Nicolas | B81C 1/00285 438/51 |
| 2016/0137491 | A1* | 5/2016 | Su | B81B 7/02 438/51 |
| 2016/0284751 | A1* | 9/2016 | Ho | H01L 24/05 |
| 2016/0320258 | A1* | 11/2016 | Zhang | G01L 19/0092 |
| 2017/0305742 | A1* | 10/2017 | Hayakawa | B81C 1/00357 |
| 2018/0275001 | A1* | 9/2018 | Tokuda | G01L 9/06 |
| 2019/0120709 | A1* | 4/2019 | Kanazawa | G01L 19/06 |
| 2020/0142236 | A1* | 5/2020 | Cheng | G02F 1/13394 |
| 2020/0166789 | A1* | 5/2020 | Yu | H04M 1/0266 |
| 2021/0055606 | A1* | 2/2021 | Nie | G02F 1/1333 |
| 2021/0088834 | A1* | 3/2021 | Yu | G02F 1/133512 |
| 2021/0232794 | A1* | 7/2021 | Lius | H01L 31/143 |
| 2021/0325703 | A1* | 10/2021 | Zhang | G09G 3/3413 |
| 2022/0173170 | A1* | 6/2022 | Yang | G09G 3/3208 |
| 2022/0190083 | A1* | 6/2022 | Yang | H10K 59/1213 |
| 2022/0238071 | A1* | 7/2022 | Chen | G09G 3/3233 |

FOREIGN PATENT DOCUMENTS

| | | | |
|---|---|---|---|
| CN | 110610661 | | 12/2019 |
| CN | 110610970 | | 12/2019 |
| CN | 111650787 | A * | 9/2020 |
| CN | 111983840 | A * | 11/2020 |
| CN | 112309989 | A * | 2/2021 |

* cited by examiner

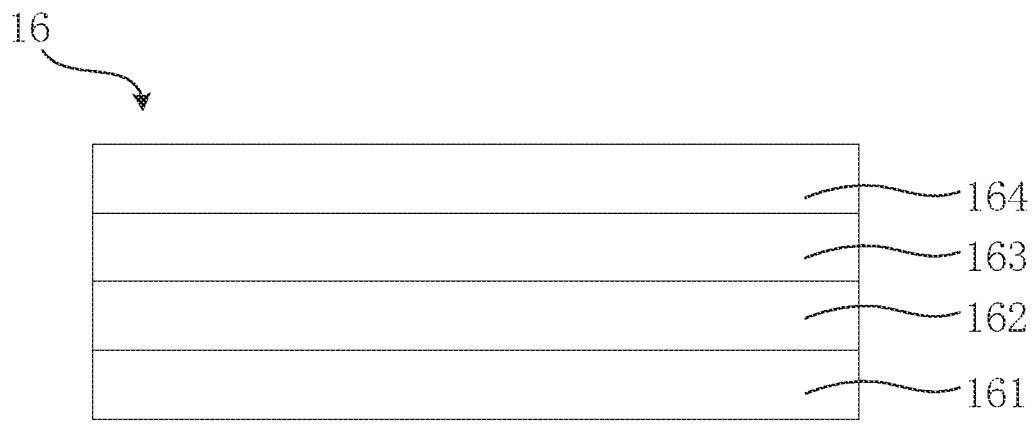

FIG. 7

| providing a first substrate and a second substrate disposed on the first substrate, wherein the light transmittance of the second substrate is greater than the light transmittance of the first substrate; | S10 |

⇩

| performing a laser process to form the at least one first through hole on the first substrate and at least one blind hole on the second substrate, wherein the blind hole is formed by recessing inwardly from a surface of the second substrate facing the first substrate, and the blind hole is provided corresponding to the first through hole; and | S20 |

⇩

| coating a light-transmitting planarization layer in the blind hole to flatten the bottom of the blind hole, wherein the material of the light-transmitting planarization layer is the same as the material of the second substrate. | S30 |

FIG. 8

DISPLAY PANEL, AND DISPLAY DEVICE INCLUDING LIGHT-TRANSMITTING PLANARIZATION LAYER IN BLIND HOLE

RELATED APPLICATIONS

This application is a National Phase of PCT Patent Application No. PCT/CN2021/078015 having International filing date of Feb. 26, 2021, which claims the benefit of priority of Chinese Patent Application No. 202110149011.6 filed on Feb. 3, 2021. The contents of the above applications are all incorporated by reference as if fully set forth herein in their entirety.

FIELD AND BACKGROUND OF THE INVENTION

The present application relates to the field of display technology, and in particular to a display panel, a manufacturing method thereof, and a display device.

At present, because the display panel adopts a double-layered yellow polyimide (YPI) substrate setting method, a light transmittance of a camera area of technology of the blind hole under-screen camera is generally 10% to 20%, resulting in poor photo effects, which limits the development of technology of the blind hole under-screen camera.

In order to increase the light transmittance of the camera area of technology of the blind hole under-screen camera, a common technical solution is to replace one YPI substrate of the display panel with a colorless and transparent polyimide (CPI) substrate, that is, the first layer of the PI substrates of the display panel still uses YPI substrate with good thermal stability, and the second layer of PI substrates is replaced by yellow PI substrate with good thermal stability to CPI substrate with good optical performance. However, after the display panel with such a structure is bonded with other module materials to form the display module, the first-layered YPI substrate in the camera area needs to be completely removed and the second-layered CPI substrate is partially removed by a laser process, and therefore, the surface of the remaining unremoved second-layered CPI substrate is poorly flat, which causes diffuse reflection when light passes through, reducing light transmittance.

In summary, there is an urgent need to provide a new display panel, a manufacturing method thereof, and a display device to solve the above technical problems.

SUMMARY OF THE INVENTION

Embodiments of the present application provide a display panel, a manufacturing method thereof, and a display device to solve the technical problem in existing display panel, wherein the first-layered YPI substrate is completely removed by a laser process, and the second-layered CPI substrate is partially removed, cause the surface of the remaining unremoved second-layer CPI substrate to be poorly flat, so that diffuse reflection occurs when light passes through, resulting in reduced light transmittance.

In order to solve the above problems, the technical solutions provided by the present application are as follows:

The present application provides a first substrate and a second substrate disposed on the first substrate, wherein a light transmittance of the first substrate is lower than a light transmittance of the second substrate, at least one first through hole is provided on the first substrate, at least one blind hole is provided on the second substrate, and the blind hole is formed by recessing inwardly from a surface of the second substrate facing the first substrate, and the blind hole is provided corresponding to the first through hole; and wherein the display panel further includes a light-transmitting planarization layer, the light-transmitting planarization layer is provided in the blind hole for flattening a bottom of the blind hole, and a material of the light-transmitting planarization layer is same as a material of the second substrate.

According to the display panel provided by the present application, the display panel further includes a water and oxygen barrier layer located between the first substrate and the second substrate, at least one second through hole is opened on the water and oxygen barrier layer, and the second through hole is provided corresponding to the first through hole and the blind hole.

According to the display panel provided by the present application, the transparent planarization layer fills part of the blind hole; or the transparent planarization layer completely fills the blind hole; or the transparent planarization layer completely fills the blind hole and partially fills the second through hole; or the light-transmitting planarization layer completely fills the blind hole and the second through hole.

According to the display panel provided by the present application, a material of the water and oxygen barrier layer includes one or a combination of silicon oxide, silicon nitride, and silicon oxynitride.

According to the display panel provided by the present application, the display panel further includes a anti-reflection film, the anti-reflection film is disposed on a side of the transparent planarization layer facing the first substrate.

According to the display panel provided by the present application, a thickness of the anti-reflection film is at sub-micron level.

According to the display panel provided by the present application, a material of the first substrate includes yellow polyimide, and a material of the second substrate includes colorless and transparent polyimide.

According to the display panel provided by the present application, the display panel further includes:
a functional layer disposed on the second substrate;
a polarizer disposed on the functional layer;
a cover plate disposed on the polarizer;
a backplate disposed on a side of the first substrate away from the functional layer; and
a heat dissipation layer disposed on a side of the backplate away from the functional layer,
wherein both the backplate and the heat dissipation layer are provided with a third through hole, and the third through hole is provided corresponding to the first through hole.

The present application provides a display device including a display panel; and
a photosensitive element disposed on one side of the display panel corresponding to a first through hole;
wherein the display panel includes a first substrate and a second substrate disposed on the first substrate, a light transmittance of the first substrate is lower than a light transmittance of the second substrate; at least one first through hole is provided on the first substrate, at least one blind hole is provided on the second substrate, and the blind hole is formed by recessing inwardly from a surface of the second substrate facing the first substrate, and the blind hole is provided corresponding to the first through hole; and
wherein the display panel further includes a light-transmitting planarization layer, the light-transmitting planarization layer is provided in the blind hole for flattening a bottom of the blind hole, and a material of the light-transmitting planarization layer is same as a material of the second substrate.

According to the display device provided by the present application, the display panel further includes a water and oxygen barrier layer located between the first substrate and the second substrate, at least one second through hole is opened on the water and oxygen barrier layer, and the second through hole is provided corresponding to the first through hole and the blind hole.

According to the display device provided by the present application, the transparent planarization layer fills part of the blind hole; or the transparent planarization layer completely fills the blind hole; or the transparent planarization layer completely fills the blind hole and partially fills the second through hole; or the light-transmitting planarization layer completely fills the blind hole and the second through hole.

According to the display device provided by the present application, a material of the water and oxygen barrier layer includes one or a combination of silicon oxide, silicon nitride, and silicon oxynitride.

According to the display device provided by the present application, the display panel further includes a anti-reflection film, the anti-reflection film is disposed on a side of the transparent planarization layer facing the first substrate.

According to the display device provided by the present application, a thickness of the anti-reflection film is at sub-micron level.

According to the display device provided by the present application, a material of the first substrate includes yellow polyimide, and a material of the second substrate includes colorless and transparent polyimide.

According to the display device provided by the present application, the display panel further includes:
  a functional layer disposed on the second substrate;
  a polarizer disposed on the functional layer;
  a cover plate disposed on the polarizer;
  a backplate disposed on a side of the first substrate away from the functional layer; and
  a heat dissipation layer disposed on a side of the backplate away from the functional layer,
  wherein both the backplate and the heat dissipation layer are provided with a third through hole, and the third through hole is provided corresponding to the first through hole.

The present application provides a method of manufacturing a display panel, including the following steps:
  providing a first substrate and a second substrate disposed on the first substrate, wherein the light transmittance of the second substrate is greater than the light transmittance of the first substrate;
  performing a laser process to form the at least one first through hole on the first substrate and at least one blind hole on the second substrate, wherein the blind hole is formed by recessing inwardly from a surface of the second substrate facing the first substrate, and the blind hole is provided corresponding to the first through hole; and
  coating a light-transmitting planarization layer in the blind hole to flatten the bottom of the blind hole, wherein the material of the light-transmitting planarization layer is the same as the material of the second substrate.

According to the method of manufacturing a display panel provided by the present application, after coating the light-transmitting planarization layer in the blind hole, the method further includes the following steps:

performing a chemical vapor deposition process to form an antireflection film on a side of the transparent planarization layer close to the first substrate.

According to the method of manufacturing a display panel provided by the present application, before performing the laser process to form the at least one first through hole on the first substrate, the method further includes the following steps:
  forming a functional layer on the second substrate;
  providing a polarizer attached to the functional layer;
  providing a cover plate attached to the polarizer;
  forming a backplate on a side of the first substrate away from the functional layer; and
  forming a heat dissipation layer on a side of the backplate away from the functional layer According to the method of manufacturing a display panel provided by the present application, a material of the first substrate includes yellow polyimide, and a material of the second substrate includes colorless and transparent polyimide.

Beneficial effect of the present application is that: the display panel and the method of manufacturing the same provided in the present application are provided with a light-transmitting planarization layer in the blind hole to flatten the bottom of the blind hole, so that the uneven surface of the unremoved second substrate is filled to be flat, thereby obtaining a relatively flat film surface, which avoids diffuse reflection caused by the uneven surface and improves the light transmittance of the second substrate. Since the material of the light-transmitting planarization layer is the same as that of the second substrate, the interface reflection between the light-transmitting planarization layer and the unremoved second substrate can be reduced, and the light transmittance of the second substrate can be further improved.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 7 is a schematic diagram of a cross-sectional structure of a functional layer of the display panel in FIG. 6.

FIG. 8 is a schematic flowchart of a method of manufacturing a display panel provided by an embodiment of the present application.

Figure 1:
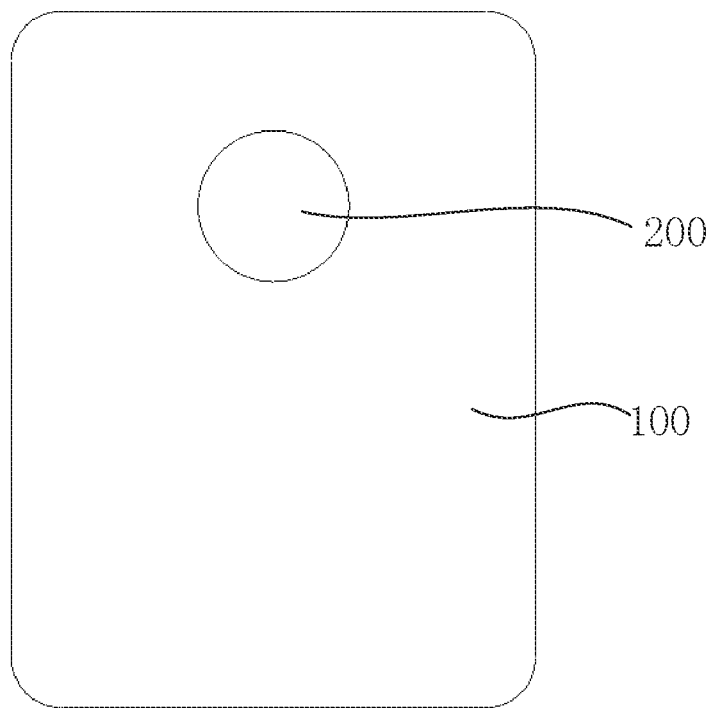
FIG. 1 is a schematic top view of a structure of a display panel provided by an embodiment of the present application.

Elements in the drawings are designated by reference numerals listed below.

100. display area; 200. under-screen light-transmitting area;

11. first substrate; 12. second substrate; 13. light-transmitting planarization layer; 14. anti-reflection film; 15. water and oxygen barrier layer; 16. functional layer; 17. polarizer; 18. cover plate; 19. backplate; 20. heat dissipation layer; 21. optical glue;

111. first through hole; 121. blind hole; 151. second through hole; 191. third through hole;

161. thin film transistor array layer; 162. organic light-emitting layer; 163. encapsulation layer; 164. touch control layer.

DESCRIPTION OF SPECIFIC EMBODIMENTS OF THE INVENTION

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Referring to FIG. 1, which is a schematic top view of a structure of a display panel provided by an embodiment of the present application. The display panel has a display area 100, the display area 100 has an under-screen light-transmitting area 200, the display area 100 is used for normal display, and the under-screen light-transmitting area 200 is used for displaying images while allowing the photosensitive element located on one side of the display panel and corresponding to the under-screen light-transmitting area 200 receive the light signal by being transparent, wherein the photosensitive element may be a camera, an optical touch component, a fingerprint recognition sensor, etc., so that the display panel can realize functions such as camera function, optical touch function, and optical fingerprint recognition. A shape of the under-screen light-transmitting area 200 may be a circle, a rectangle, a rounded rectangle, or an irregular polygon, and the display panel may include a plurality of the under-screen light-transmitting areas 200. It should be noted that the embodiment of the present application takes the photosensitive element as a camera as an example for illustration.

Figure 2:
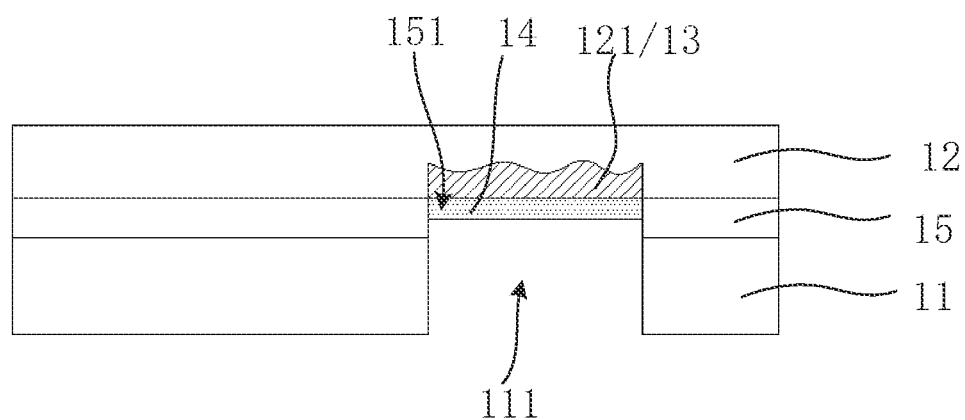
FIG. 2 is a schematic diagram of a first cross-sectional structure of a display panel provided by an embodiment of the present application.

Referring to FIG. 2, which is a schematic diagram of a first cross-sectional structure of a display panel provided by an embodiment of the present application. The display panel includes a first substrate 11 and a second substrate 12 disposed on the first substrate 11. In order to increase the light transmittance of the under-screen light-transmitting area 200, the light transmittance of the first substrate 11 is less than the light transmittance of the second substrate 12. It is understandable that a display panel usually uses a flexible material as a substrate due to the high limit elongation of the low-transmittance flexible material but the poor optical transmission performance, and thus it is easy to cause incomplete collection of the framing information of the under-screen camera. High-transmittance flexible materials have high optical transmission performance, but have poor ultimate tensile properties, and are likely to break when peeled off. Therefore, a flexible material with low light transmittance is usually used as the first substrate 11, and a flexible material with high light transmittance is used as the second substrate 12. The first substrate 11 and the second substrate 12 are stacked to form a display panel. The advantages of the first substrate 11 and the second substrate 12 are complementary to each other, which not only ensures that the substrate has good mechanical properties and avoids breaking when peeled off, but also satisfies the high light transmittance requirements of the under-screen light-transmitting area 200, thereby avoiding yellowing of the shooting effect.

At least one first through hole 111 is opened on the first substrate 11 by using a laser process, and at least one blind hole 121 is opened on the second substrate 12, and the blind hole 121 is formed by recessing inwardly from a surface of the second substrate 12 facing the first substrate 11, and the blind hole is provided corresponding to the first through hole 111. It can be understood that the first through hole 111 and the blind hole 121 are both provided corresponding to the under-screen light-transmitting area 200. Since the second substrate 12 at a position corresponding to the blind hole 121 has not been completely removed, the surface of the remaining unremoved second substrate 12 is poorly flat, so that diffuse reflection occurs when light passes through, thus reducing the light transmittance.

In order to overcome the above-mentioned drawbacks, the display panel provided by an embodiment of the present application further includes a light-transmitting planarization layer 13 provided in the blind hole 121 for flattening a bottom of the blind hole 121, so as to fill and flatten the uneven surface of the unremoved second substrate 12 to obtain a relatively flat film surface, thereby avoiding diffuse reflection caused by the uneven surface and improving the light transmittance of the second substrate 12. In the embodiment of the present application, the material of the light-transmitting planarization layer 13 is the same as the material of the second substrate 12. Since the material of the light-transmitting planarization layer 13 and the second substrate 12 have the same chemical composition, the interface reflection between the light-transmitting planarization layer 13 and the unremoved second substrate 12 can be reduced, and the uneven surface can be flattened more easily without reducing the light transmittance of the second substrate 12.

In the embodiment of the present application, the thickness of the transparent planarization layer 13 is not particularly limited, and only needs to satisfy the flattening object of the uneven surface of the bottom of the blind hole 121. However, because the overall thickness of the second substrate 12 is too high, the overall mechanical properties of the second substrate 12 will be poor. Therefore, the side surface of the transparent planarization layer 13 close to the first substrate 11 is not higher than the side surface of the first substrate 11 close to the second substrate 12, that is, the bottom surface of the light-transmitting planarization layer 13 should not exceed the top surface of the second substrate 12. Preferably, the surface of the light-transmitting planarization layer 13 close to the first substrate 11 is flush with the surface of the first substrate 11 close to the second substrate 12, so that the thickness of the surface of the second substrate 12 is consistent with the thickness of second substrate 12 provided without the blind hole 121, so as to avoid a step difference. Specifically, in order to achieve the foregoing object, the embodiment of the present application may make the thickness of the remaining unremoved second substrate 12 less than half of the original thickness of the second substrate 12.

The display panel also includes a water and oxygen barrier layer 15 located between the first substrate 11 and the second substrate 12, on the one hand for blocking water and oxygen, on the other hand for preventing the first substrate 11 and the second substrate 12 from being damaged by laser peeling off. At least one second through hole 151 is opened on the water and oxygen barrier layer 15, and the second through hole 151 is provided corresponding to the first through hole 111 and the blind hole 121. Specifically, the material of the water and oxygen barrier layer 15 may include an inorganic layer, such as one or a combination of silicon oxide, silicon nitride, and silicon oxynitride.

The surface of the light-transmitting planarization layer 13 close to the first substrate 11 is located in the second through hole 151, and the light-transmitting planarization layer 13 has various thicknesses based on the conditions. which are listed below, and which case is specifically selected is based on the actual situation.

Figure 3:
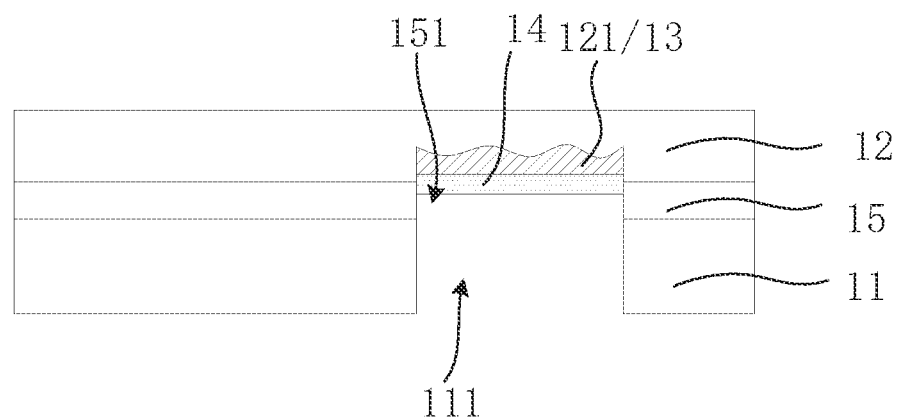
FIG. 3 is a schematic diagram of a second cross-sectional structure of a display panel provided by an embodiment of the present application.

In the first case, referring to FIG. 3, the transparent planarization layer 13 fills a part of the blind hole 121, and at this time, due to a small sun of the thicknesses of the remaining unremoved second substrate 12 and the transparent planarization layer 13, the light transmittance of the second substrate 12 is relatively high.

In the second case, still referring to FIG. 2. on the basis of the first case, the transparent planarization layer 13 can completely fill the blind hole 121. At this time, because the sun of the thicknesses of the remaining unremoved second substrate 12 and the transparent planarization layer 13 is equal to the thickness of the second substrate 12 when the blind hole is not opened, it can make the second substrate 12 remains as its original is in the case of avoiding a decrease in light transmittance caused by an uneven surface.

Figure 4:
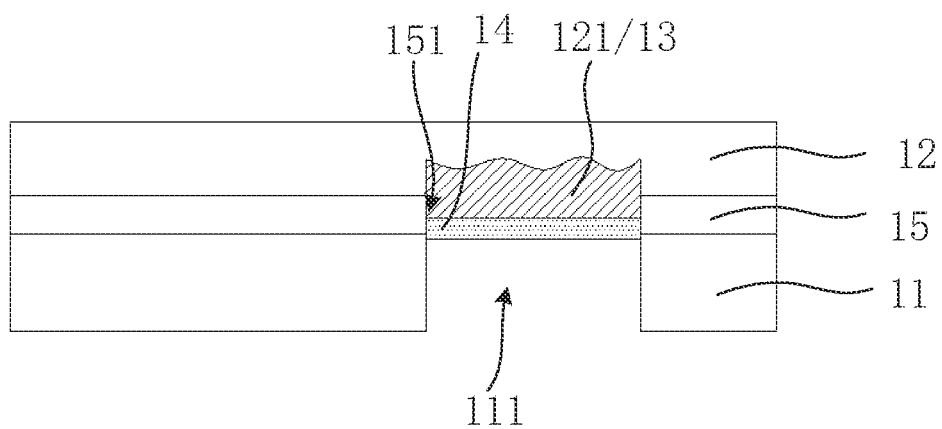
FIG. 4 is a schematic diagram of a third cross-sectional structure of a display panel provided by an embodiment of the present application.

In the third case, referring to FIG. 4, the transparent planarization layer 13 fills the blind hole 121 and partially fills the second through hole 151, due to the greater sun of the thicknesses of the remaining unremoved second substrate 12 and the transparent planarization layer 13, the mechanical properties of the second substrate 12 is better than the first case.

Figure 5:
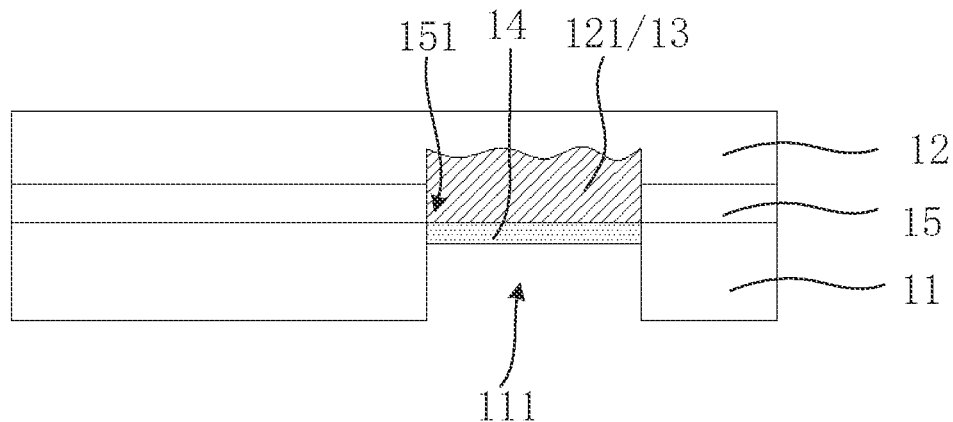
FIG. 5 is a schematic diagram of a fourth cross-sectional structure of a display panel provided by an embodiment of the present application.

In the fourth case, referring to FIG. 5, based on the third case, the transparent planarization layer 13 can completely fill the blind hole 121 and the second through hole 151.

Specifically, the material of the first substrate 11 may be yellow polyimide, and the material of the second substrate 12 may be colorless and transparent polyimide. The ultimate elongation of the yellow polyimide material is about twice that of the colorless and transparent polyimide material, and the colorless and transparent polyimide has high optical transmittance, which can meet the light transmission requirements of the under-screen light-transmitting area.

Further, the light-transmitting planarization layer 13 is provided with an anti-reflection film 14 on the side close to the first substrate 11, which can further reduce the light-transmitting planarization layer 13 and the unremoved second substrate 12. The reflection of the interface increases the light transmittance of the under-screen light-transmitting area 200, and an excellent shooting effect is obtained. Specifically, the thickness of the antireflection and antireflection film 14 is sub-micron. The material of the antireflection and antireflection film 14 may be resin.

Figure 6:
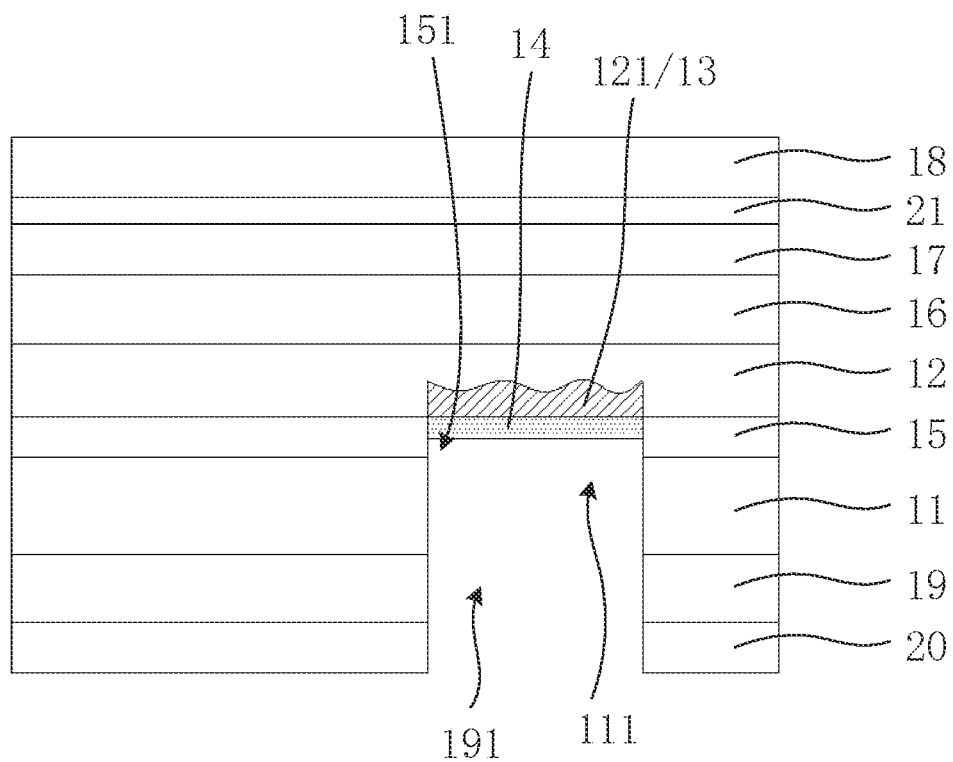
FIG. 6 is a schematic diagram of a fifth cross-sectional structure of a display panel provided by an embodiment of the present application.

It should be noted that, referring to FIG. 6, the display panel also includes structures such as a functional layer 16, a polarizer 17, a cover plate 18, a backplate 19, and a heat dissipation layer 20. The functional layer 16 is disposed on the second substrate 12, the polarizer 17 is disposed on the functional layer 16, and an optical glue 21 is disposed between the cover plate 18 and the polarizer 17. The backplate 19 is disposed on the side of the first substrate 11 away from the second substrate 12 and functions to support the display panel. The heat dissipation layer 20 is disposed on a side of the backplate 19 away from the first substrate 11 for heat dissipation of the display panel. The material of the heat dissipation layer 20 may include SCF composite material. Each of the backplate 19 and the heat dissipation layer 20 are provided with a third through hole 191, the third through hole 191 is arranged correspondingly to the first through hole 111, the second through hole 151, and the blind hole 121.

Specifically, referring to FIG. 7, the functional layer 16 includes a thin film transistor array layer 161, an organic light-emitting layer 162, an encapsulation layer 163, and a touch control layer 164. The thin film transistor array layer 161 is disposed on the second substrate 12. Specifically, the thin film transistor array layer 161 includes a plurality of thin film transistors. The thin film transistors may be low temperature polysilicon thin film transistors. The thin film transistor array layer includes a first metal layer, a gate insulating layer, an active layer, a second metal layer, and a passivation layer. The organic light-emitting layer 162 is disposed on the thin film transistor array layer 161 for emitting light of multiple colors. The organic light-emitting layer 162 may include a red light-emitting layer, a green light-emitting layer, and a blue light-emitting layer. The encapsulation layer 163 is disposed on the organic light-emitting layer 162 to prevent the organic light-emitting layer 162 from corroding by external water and oxygen and causing failure. The encapsulation layer 163 can be encapsulated by thin film encapsulation. The touch layer 164 is disposed on the encapsulation layer 163, and a direct on-cell touch (DOT) solution can be used to directly fabricate the touch layer on a thin film encapsulation layer to realize the touch function.

Referring to FIG. 8, FIG. 8 is a schematic flow chart of a method of manufacturing a display panel provided by an embodiment of the present application, and FIG. 8A to FIG. 8D are schematic structural flowcharts of a method of manufacturing the display panel provided by an embodiment of the present application. The method of manufacturing the display panel includes the following steps:

S10: providing a first substrate 11 and a second substrate 12 on the first substrate 11, wherein the light transmittance of the second substrate 12 is greater than the light transmittance of the first substrate 11.

Figure 8A:
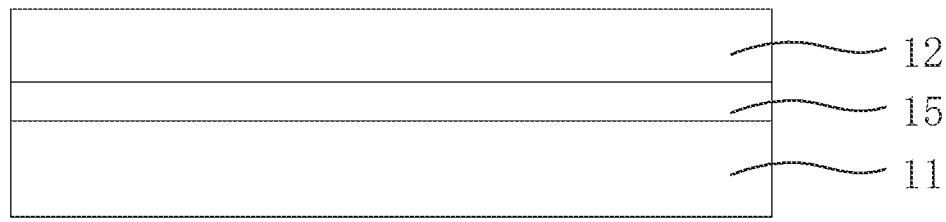
FIG. 8A to FIG. 8D are schematic structural flowcharts of a method of manufacturing the display panel provided by an embodiment of the present application.

Specifically, referring to FIG. 8A, a water and oxygen barrier layer 15 is further provided between the first substrate 11 and the second substrate 12. The material of the water and oxygen barrier layer 15 may be an inorganic layer, such as one or a combination of silicon oxide, silicon nitride, and silicon oxynitride. The material of the first substrate 11 may be yellow polyimide, and the material of the second substrate 12 may be colorless and transparent polyimide. The ultimate elongation of the yellow polyimide material is about twice that of the colorless and transparent polyimide material, and the colorless and transparent polyimide has high optical transmittance, which can meet the light transmission requirements of the under-screen light-transmitting area.

S20: performing a laser process to form the at least one first through hole 111 on the first substrate 11 and at least one blind hole 121 on the second substrate 12, wherein the blind hole 121 is formed by recessing inwardly from a surface of the second substrate 12 facing the first substrate 11, and the blind hole 121 is provided corresponding to the first through hole 111.

Figure 8B:
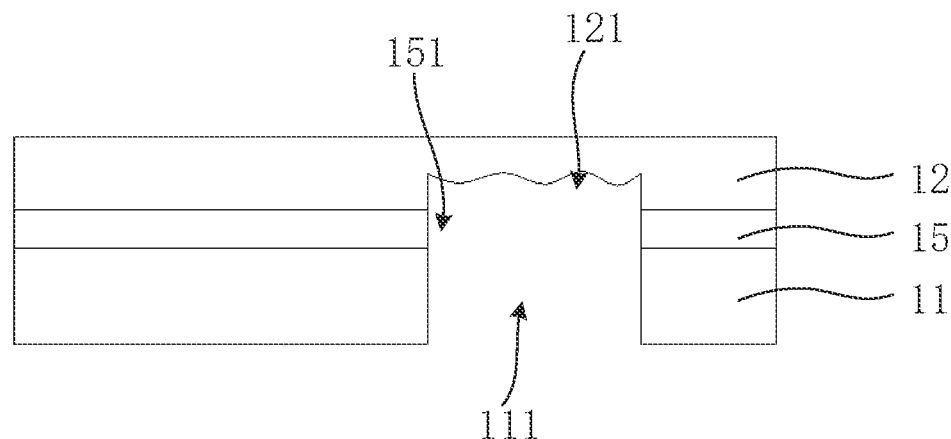

Specifically, referring to FIG. 8B, a laser is used to irradiate the under-screen light-transmitting area of the first substrate 11, and the part of the first substrate 11 in the under-screen light-transmitting area is completely removed to form the first through hole 111; the part of the second substrate 12 in the under-screen light-transmitting area is not completely removed to form the blind hole 121, and the blind hole 121 is provided corresponding to the first through hole 111. In the embodiment of the present application, the thickness of the remaining unremoved second substrate 12 is less than half of the original thickness of the second substrate 12.

Further, the water and oxygen barrier layer 15 is irradiated by the same laser process to form a second through hole 151 on the water and oxygen barrier layer, and the second through hole 151 is arranged corresponding to the first through hole 111.

S30: coating a light-transmitting planarization layer 13 in the blind hole 121, wherein the material of the light-transmitting planarization layer 13 is the same as the material of the second substrate 12.

Figure 8C:
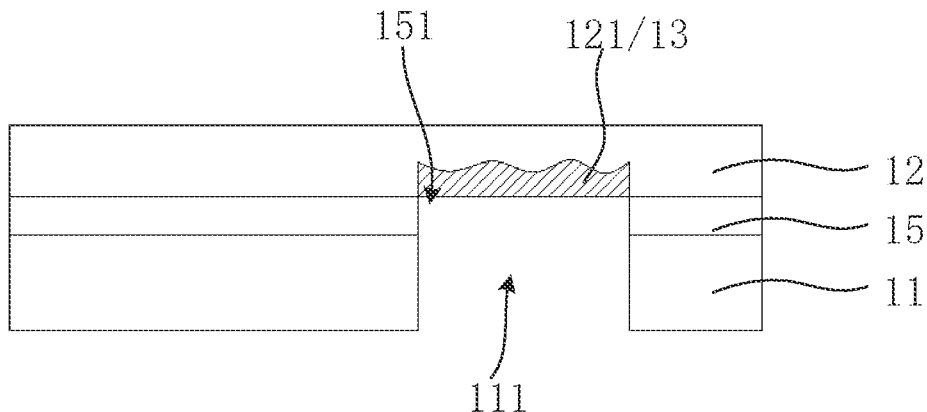

Specifically, referring to FIG. 8C, in the embodiment of the present application, the material of the transparent planarization layer 13 is also a colorless and transparent polyamide. Since the material of the light-transmitting planarization layer 13 and the material of the second substrate 12 have the same chemical composition, the interface reflection between the light-transmitting planarization layer 13 and the unremoved second substrate 12 can be reduced, and the flatness of the uneven surface is easier to achieve without reducing the light transmittance of the second substrate 12.

Figure 8D:
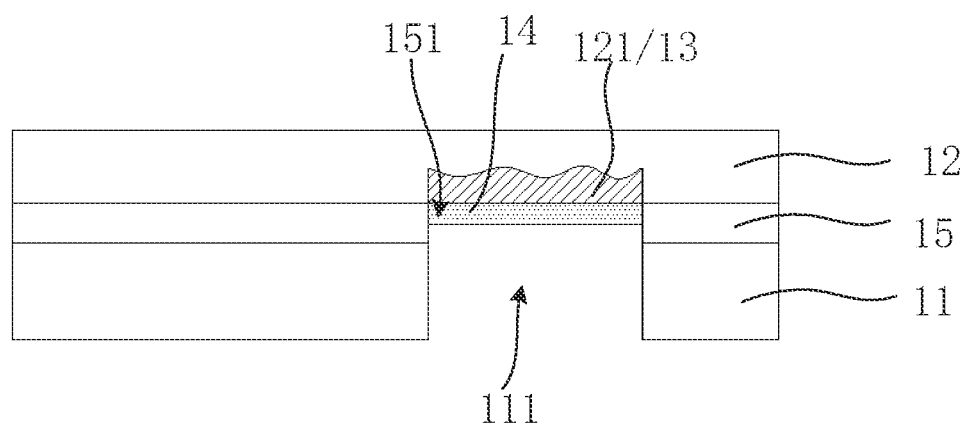

Further, referring to FIG. 8D, after coating and forming the light-transmitting planarization layer 13 in the blind hole 121, the method further includes the following step: performing a chemical vapor deposition process to form an antireflection film 14 on a side of the transparent planarization layer 13 close to the first substrate 11. Specifically, the thickness of the anti-reflection film 14 is at sub-micron level, and the material of the anti-reflection film 14 may include resin, which can further reduce the interface reflection between the light-transmitting planarization layer 13 and the unremoved second substrate 12, thereby improving the light transmittance of the under-screen light-transmitting area and obtaining excellent photographing effects.

It should be noted that before performing the laser process to form the at least one first through hole 111 on the first substrate 11, the method further includes the following steps: forming a functional layer on the second substrate 12; providing a polarizer attached to the functional layer; providing a cover plate attached to the polarizer; forming a backplate on a side of the first substrate 11 away from the functional layer; and forming a heat dissipation layer on a side of the backplate away from the functional layer. Specifically, forming a functional layer on the second substrate 12 includes the following steps: forming a thin film transistor array layer on the second substrate 12; forming an organic light-emitting layer on the thin film transistor array layer; forming an encapsulation layer on the organic light-emitting layer; and forming a touch control layer on the encapsulation layer. Since this is a prior art, it will not be described in detail herein.

An embodiment of the present application further provides a display device, the display device including the above-mentioned display panel and a photosensitive element, the photosensitive element is arranged on one side of the display panel corresponding to the under-screen light-transmitting area. Specifically, the photosensitive element may be a camera, and the display device may be any product or component with a display function, such as a mobile phone, a tablet computer, a television, a monitor, a notebook computer, a digital photo frame, a navigator, etc.

Beneficial effect of the present application is that: the display panel and the method of manufacturing the same provided in the present application are provided with a light-transmitting planarization layer in the blind hole to flatten the bottom of the blind hole, so that the uneven surface of the unremoved second substrate is filled to be flat, thereby obtaining a relatively flat film surface, which avoids diffuse reflection caused by the uneven surface and improves the light transmittance of the second substrate. Since the material of the light-transmitting planarization layer is the same as that of the second substrate, the interface reflection between the light-transmitting planarization layer and the unremoved second substrate can be reduced, and the light transmittance of the second substrate can be further improved.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising a first substrate and a second substrate disposed on the first substrate, wherein a light transmittance of the first substrate is lower than a light transmittance of the second substrate, at least one first through hole is provided on the first substrate, at least one blind hole is provided on the second substrate, and the blind hole is formed by recessing inwardly from a surface of the second substrate facing the first substrate, and the blind hole is provided corresponding to the first through hole; and wherein the display panel further comprises a light-transmitting planarization layer, the light-transmitting planarization layer is provided in the blind hole for flattening a bottom of the blind hole, and a material of the light-transmitting planarization layer is same as a material of the second substrate.

2. The display panel according to claim 1, wherein the display panel further comprises a water and oxygen barrier layer located between the first substrate and the second substrate, at least one second through hole is opened on the water and oxygen barrier layer, and the second through hole is provided corresponding to the first through hole and the blind hole.

3. The display panel according to claim 2, wherein the transparent planarization layer fills part of the blind hole; or the transparent planarization layer completely fills the blind hole; or the transparent planarization layer completely fills the blind hole and partially fills the second through hole; or the light-transmitting planarization layer completely fills the blind hole and the second through hole.

4. The display panel according to claim 2, wherein a material of the water and oxygen barrier layer comprises one or a combination of silicon oxide, silicon nitride, and silicon oxynitride.

5. The display panel according to claim 1, wherein the display panel further comprises a anti-reflection film, the anti-reflection film is disposed on a side of the transparent planarization layer facing the first substrate.

6. The display panel according to claim 5, wherein a thickness of the anti-reflection film is at sub-micron level.

7. The display panel according to claim 1, wherein a material of the first substrate comprises yellow polyimide, and a material of the second substrate comprises colorless and transparent polyimide.

8. The display panel according to claim 1, further comprising:
    a functional layer disposed on the second substrate;
    a polarizer disposed on the functional layer;
    a cover plate disposed on the polarizer;
    a backplate disposed on a side of the first substrate away from the functional layer; and
    a heat dissipation layer disposed on a side of the backplate away from the functional layer, wherein both the backplate and the heat dissipation layer are provided with a third through hole, and the third through hole is provided corresponding to the first through hole.

9. A method of manufacturing the display panel according to claim 1, comprising the following steps:
    providing a first substrate and a second substrate disposed on the first substrate, wherein the light transmittance of the second substrate is greater than the light transmittance of the first substrate;
    performing a laser process to form the at least one first through hole on the first substrate and at least one blind hole on the second substrate, wherein the blind hole is formed by recessing inwardly from a surface of the second substrate facing the first substrate, and the blind hole is provided corresponding to the first through hole; and
    coating a light-transmitting planarization layer in the blind hole to flatten the bottom of the blind hole, wherein the material of the light-transmitting planarization layer is the same as the material of the second substrate.

10. The method of manufacturing a display panel according to claim 9, wherein after coating the light-transmitting planarization layer in the blind hole, the method further comprises the following steps:
    performing a chemical vapor deposition process to form an antireflection film on a side of the transparent planarization layer close to the first substrate.

11. The method of manufacturing a display panel according to claim 9, wherein before performing the laser process to form the at least one first through hole on the first substrate, the method further comprises the following steps:
    forming a functional layer on the second substrate;
    providing a polarizer attached to the functional layer;
    providing a cover plate attached to the polarizer;
    forming a backplate on a side of the first substrate away from the functional layer; and
    forming a heat dissipation layer on a side of the backplate away from the functional layer.

12. The method of manufacturing a display panel according to claim 9, wherein a material of the first substrate comprises yellow polyimide, and a material of the second substrate comprises colorless and transparent polyimide.

* * * * *